United States Patent
Lim et al.

(10) Patent No.: US 7,465,368 B2
(45) Date of Patent: Dec. 16, 2008

(54) DIE MOLDING FOR FLIP CHIP MOLDED MATRIX ARRAY PACKAGE USING UV CURABLE TAPE

(75) Inventors: Szu Shing Lim, Penang (MY); Sheou Hooi Lim, Penang (MY); Yew Wee Cheong, Penang (MY)

(73) Assignee: Intel Corporation, Santa Clara, CA (US)

( * ) Notice: Subject to any disclaimer, the term of this patent is extended or adjusted under 35 U.S.C. 154(b) by 721 days.

(21) Appl. No.: 10/745,728

(22) Filed: Dec. 24, 2003

(65) Prior Publication Data

US 2005/0145328 A1    Jul. 7, 2005

(51) Int. Cl.
| | |
|---|---|
| B29C 63/22 | (2006.01) |
| B29C 63/48 | (2006.01) |
| B29C 65/50 | (2006.01) |
| B29C 67/00 | (2006.01) |
| B32B 37/00 | (2006.01) |
| B32B 38/04 | (2006.01) |
| B32B 38/10 | (2006.01) |
| B31D 1/02 | (2006.01) |
| H01L 21/56 | (2006.01) |

(52) U.S. Cl. ............... 156/247; 156/248; 156/250; 156/344; 264/272.15; 264/272.17; 264/492; 264/494; 29/832

(58) Field of Classification Search ............... 156/155, 156/242, 243, 244.17, 244.18, 246–250, 156/272.2, 344; 264/492, 494, 496, 272.14, 264/272.15, 272.17; 29/832
See application file for complete search history.

(56) References Cited

U.S. PATENT DOCUMENTS

| | | | | |
|---|---|---|---|---|
| 5,450,283 | A * | 9/1995 | Lin et al. | 361/704 |
| 5,622,900 | A * | 4/1997 | Smith | 438/464 |
| 6,331,737 | B1 * | 12/2001 | Lim et al. | 257/787 |
| 6,395,578 | B1 * | 5/2002 | Shin et al. | 438/106 |
| 6,524,881 | B1 * | 2/2003 | Tandy et al. | 438/69 |
| 6,564,454 | B1 * | 5/2003 | Glenn et al. | 29/852 |
| 6,630,371 | B2 * | 10/2003 | Hembree | 438/118 |
| 6,698,488 | B2 * | 3/2004 | Ishinoda | 156/496 |

OTHER PUBLICATIONS

Abstract of RD 266,009 A.*

* cited by examiner

*Primary Examiner*—Philip C Tucker
*Assistant Examiner*—Sing P Chan
(74) *Attorney, Agent, or Firm*—Blakely, Sokoloff, Taylor & Zafman LLP

(57) ABSTRACT

An embodiment of the present invention is a technique to package flip chip molded matrix array package. An ultraviolet (UV) curable tape is laminated on die backside of a strip of array of flip chips. The UV curable tape has an adhesive strength. The strip of flip chip arrays is molded with a mold film. The molded strip of flip chip array is irradiated using UV radiation. In another embodiment, a double functional tape is mounted to backside of a wafer. The double functional tape includes a binding tape and a ultraviolet (UV) curable tape having an adhesive strength. The wafer is singulated into die. The die is attached to a substrate strip to form a strip of array of flip chips. The strip is molded with a mold film. The molded strip is irradiated using UV radiation.

12 Claims, 6 Drawing Sheets

DIE MOLDING FOR FLIP CHIP MOLDED MATRIX ARRAY PACKAGE USING UV CURABLE TAPE

BACKGROUND

1. Field of the Invention

Embodiments of the invention relate to the field of semiconductor, and more specifically, to device packaging.

2. Description of Related Art

Flip chip application on semiconductor packaging has become popular with the benefit of higher density of input/output (I/O) routing and smaller package size. However, compared to wire bonding technology the trade off is higher manufacturing cost. With the Flip chip packaging concept of matrix array, the package can be manufactured with lower cost and shorter throughput time (TPT). Thin substrate (2 to 4 layers with thin substrate core) is used for Flip Chip Molded Matrix Array Package (FCMMAP) in order to obtain better electrical performance. Thus the package needs to be molded to improve the package stiffness.

Current molding process to expose die backside is to apply a layer of compressive molding film on top of the package to prevent the molding compound from overflowing to the die backside. However, the strip designed for FCMMAP usually have uneven thickness across the molding film, causing the molding compound to seep into the gap between the mold films and the die backside.

BRIEF DESCRIPTION OF THE DRAWINGS

Embodiments of the invention may best be understood by referring to the following description and accompanying drawings that are used to illustrate embodiments of the invention. In the drawings.

DESCRIPTION

An embodiment of the present invention is a technique to package flip chip array. An ultraviolet (UV) curable tape is laminated on die backside of a strip of arrays of flip chips. The UV curable tape has an adhesive strength. The strip of flip chip array is molded with a mold film. The molded strip of flip chip array is irradiated using UV radiation. In another embodiment, a double functional tape is mounted to backside of a wafer during the die preparation phase. The double functional tape includes a binding tape and an ultraviolet (UV) curable tape having an adhesive strength. The mounted wafer is then saw singulated into die. Subsequently, the die is attached to the substrate strip in array form. During the molding phase, the strip of arrays is molded with a mold film. The molded strip of arrays is irradiated using UV radiation.

In the following description, numerous specific details are set forth. However, it is understood that embodiments of the invention may be practiced without these specific details. In other instances, well-known circuits, structures, and techniques have not been shown in order not to obscure the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, a method of manufacturing or fabrication, etc.

Figure 1:
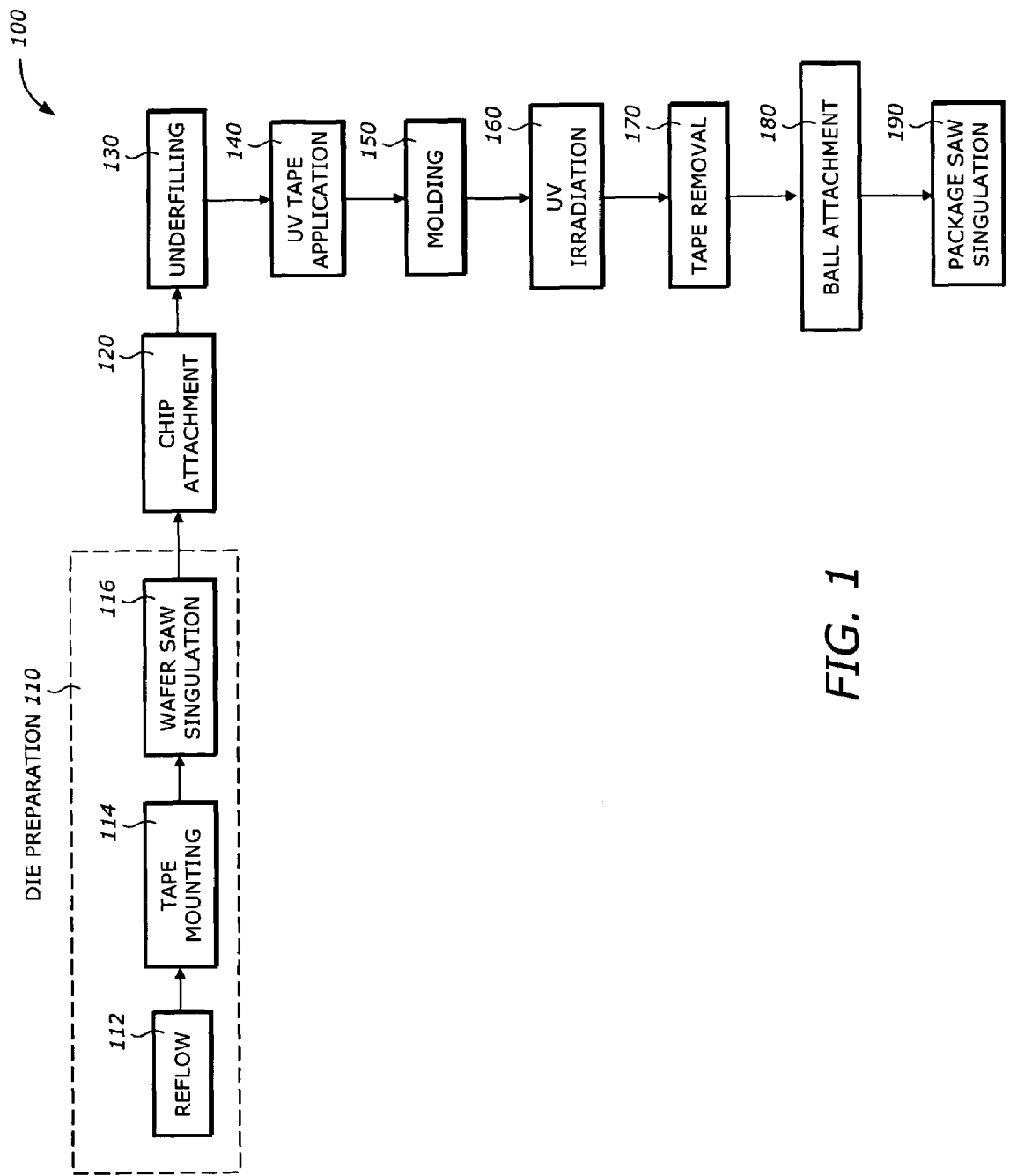
FIG. 1 is a diagram illustrating a process with separate tape application in which one embodiment of the invention can be practiced.

FIG. 1 is a diagram illustrating a process 100 with separate tape application in which one embodiment of the invention can be practiced. The process 100 includes die preparation 110, chip attachment 120, underfilling 130, UV tape application 140, molding 150, UV irradiation 160, tape removal 170, ball attachment 180 and package saw singulation 190.

The die preparation 110 prepares the die for package processing. It includes die bump reflow 112, tape mounting 114, and wafer saw singulation 116. The reflow 112 is used to remove the oxide layer of the die bump. The tape mounting 114 mounts a tape to wafer with a tape mounting device and a wafer holder to hold the wafer into position. The tape is typically a polyvinylchloride (PVC) sheet or polyester (e.g., Nylon) tape with synthetic adhesive on one side to hold both the wafer holder and the wafer. The wafer saw/singulation 116 cuts the wafer into individual die.

The chip attachment 120 provides the mechanical and electrical connection of the die to the substrate after wafer dicing or singulation. It may involve the reflow of a die to a substrate/interposer using lead-free, high lead, or eutectic solders and typically occurs in a convection reflow oven. The die is attached to a substrate strip to form a strip of array of flip chips.

The underfilling 130 is a process that dispenses epoxy based underfill material to fill up the gap between the chip and the substrate. It protects the bumps and the flip-chip surface from moisture, contaminants, and other environmental hazards. It also helps to redistribute the stress and the strain over the entire silicon chip, improving in solder joint reliability. The underfilling may be performed by needle dispensation along the edges/corners of the chip. Capillary action then draws the dispensed underfill inwards, until the whole die shadow is fully covered by underfill material. The underfill is then cured with static oven.

The UV tape application 140 applies an ultraviolet (UV) curable tape on die backside of the strip of flip chip array. The UV curable tape has an adhesive strength to create strong bonding with the die backside. It is curable by UV radiation which reduces the adhesive strength after the molding. The UV tape is compatible with high temperature process, e.g., up to 260 degrees Celsius. The use of the tape is to prevent the mold flash on the die backside. The UV tape keeps the die backside clean and will not create noise to the Scanning Acoustical Microscopy (CSAM) during void and delamination inspection. Using the UV tape also reduces the potential risk of compatibility between thermal interface material (TIM) to die backside, resulting in better heat transfer. In addition, it also keeps the flip chips clean from cosmetic defects.

The molding 150 molds the strip of flip chip array with a mold film. The main objective of molding is to increase the package stiffness due to the thin substrate nature.

The UV irradiation 160 irradiates the molded strip of flip chip array using UV radiation with a radiation dosage that is sufficient to weaken the adhesive strength of the UV tape to facilitate the tape removal.

The tape removal 170 removes the tape by peeling it off the die. The removal can be performed automatically with a tape remover or manually by an operator. With UV radiation, the polymer is cured and consequently its adhesive strength is reduced. The tape can easily be peeled off leaving no contaminant/material on the die backside.

The ball attachment 180 attaches balls to the Ball Grid Array (BGA) package land. The solder ball attachment is second level interconnect which is for board mounting purpose.

The package saw singulation 190 singulates the individual units from the strip of arrays for final packaging.

Figure 2:
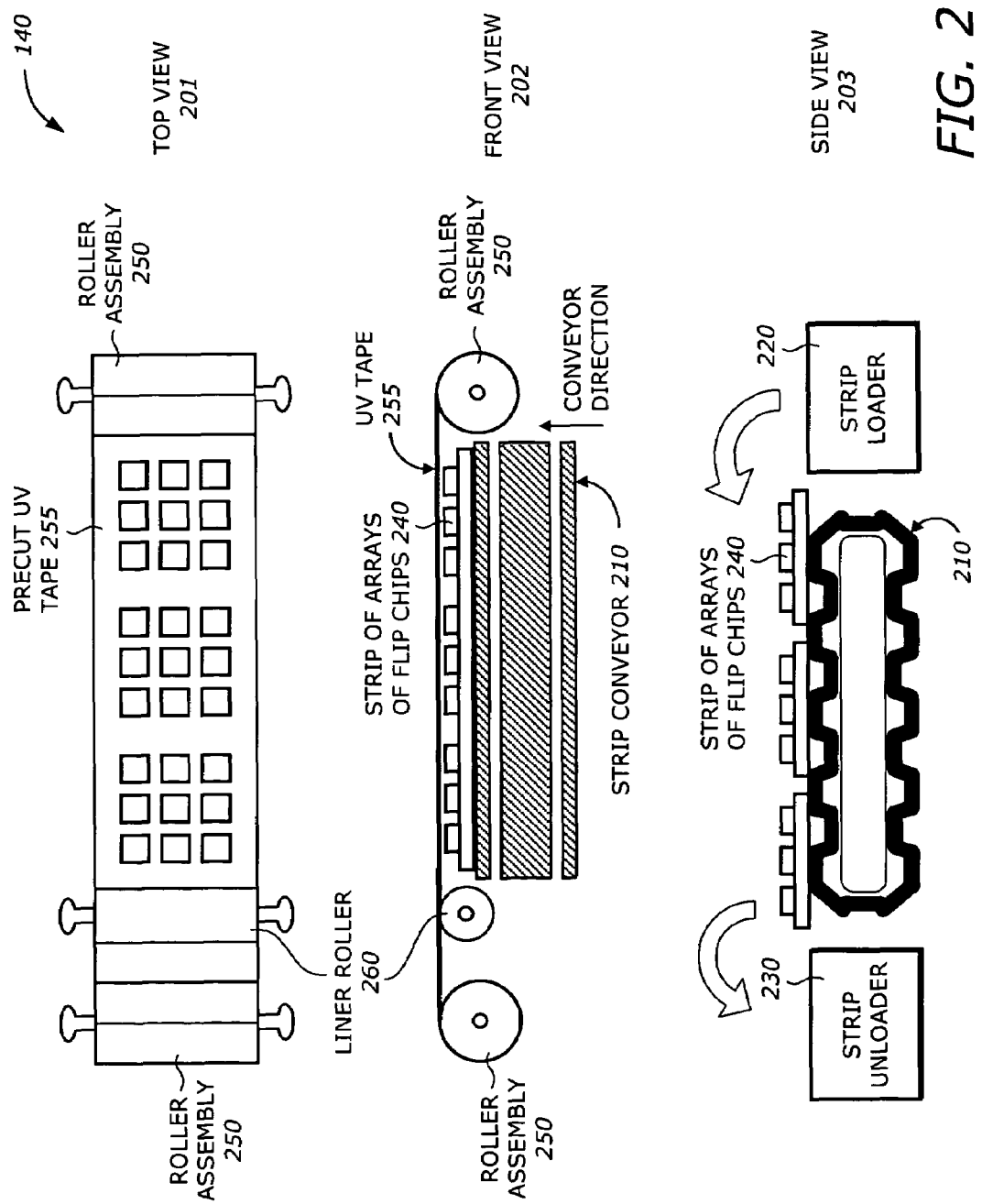
FIG. 2 is a diagram illustrating a tape application system according to one embodiment of the invention.

FIG. 2 is a diagram illustrating for the tape application 140 according to one embodiment of the invention. The tape application 140 includes a strip conveyor 210 and a roller assembly 250. The tape application 140 shows top view 201, front view 202, and side view 203 for the equipment used in tape application.

The conveyor 210 carries a strip of arrays 240. The conveyor 210 moves the strip 240 as part of the assembly for tape lamination. The strip 240 of arrays of flip chips is moved to align with the roller assembly 250 ready for tape lamination. A strip loader 220 loads the strips of arrays onto the conveyor 210. After the lamination, the conveyor 210 moves to transfer the strip 240 to a strip unloader 230 so that it can be moved to the next station or stage in the packaging process.

The roller assembly 250 has a UV curable tape 255. To facilitate the lamination, the UV curable tape 255 is precut to fit the strip 240. It is then attached to the roller assembly 250. The liner roller 260 collects the UV tape liner by peeling off the UV tape from its liner and allows only the UV tape 255 to attach to the strip 240. The roller assembly 250 can be lifted up and down. It is moved downward to apply the tape 255 on the strip 240. The tape 255 is bonded to the backside of the flip chips on the strip 240. Then, the tape 255 is cut and the roller assembly 250 is lifted up so that the conveyor 210 can move the laminated strips to the unloader 230.

Figure 3:
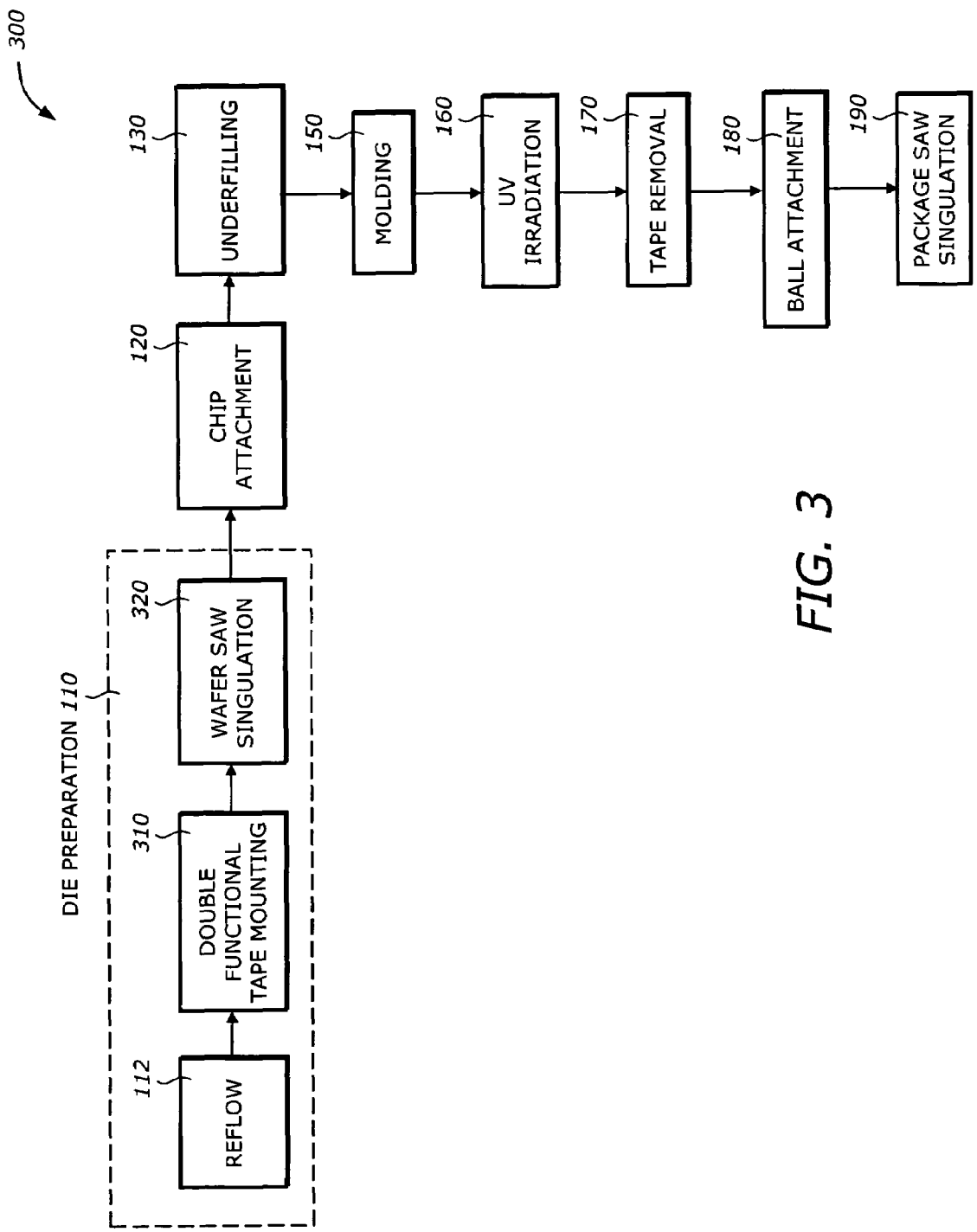
FIG. 3 is a diagram illustrating a process with double functional tape mounting in which one embodiment of the invention can be practiced.

FIG. 3 is a diagram illustrating a process 300 with double functional tape mounting in which one embodiment of the invention can be practiced. The process 300 is similar to the process 100 except that it does not have a separate UV tape application 140. Instead, the tape application is integrated with the tape mounting as part of the die preparation 110.

The die preparation 110 includes the reflow 112, a double functional tape mounting 310, and a wafer saw singulation 320. The reflow 112 is the same as that in the process 100. The double functional tape mounting 310 mounts a double functional tape on the backside of the wafer. The double functional tape includes a conventional binding tape such as a polyester (e.g., Mylar) and a UV curable tape with an adhesive strength higher than that of the binding tape. The UV tape is in direct contact with the wafer. The wafer saw singulation 320 cuts the wafer into individual die. The singulated die are then attached to the substrate strip to form a strip of array of flip chips. The wafer saw singulation 320 cuts through the UV tape but only cuts partially through the binding tape so that the singulated die is still held in the original position.

Figure 4:
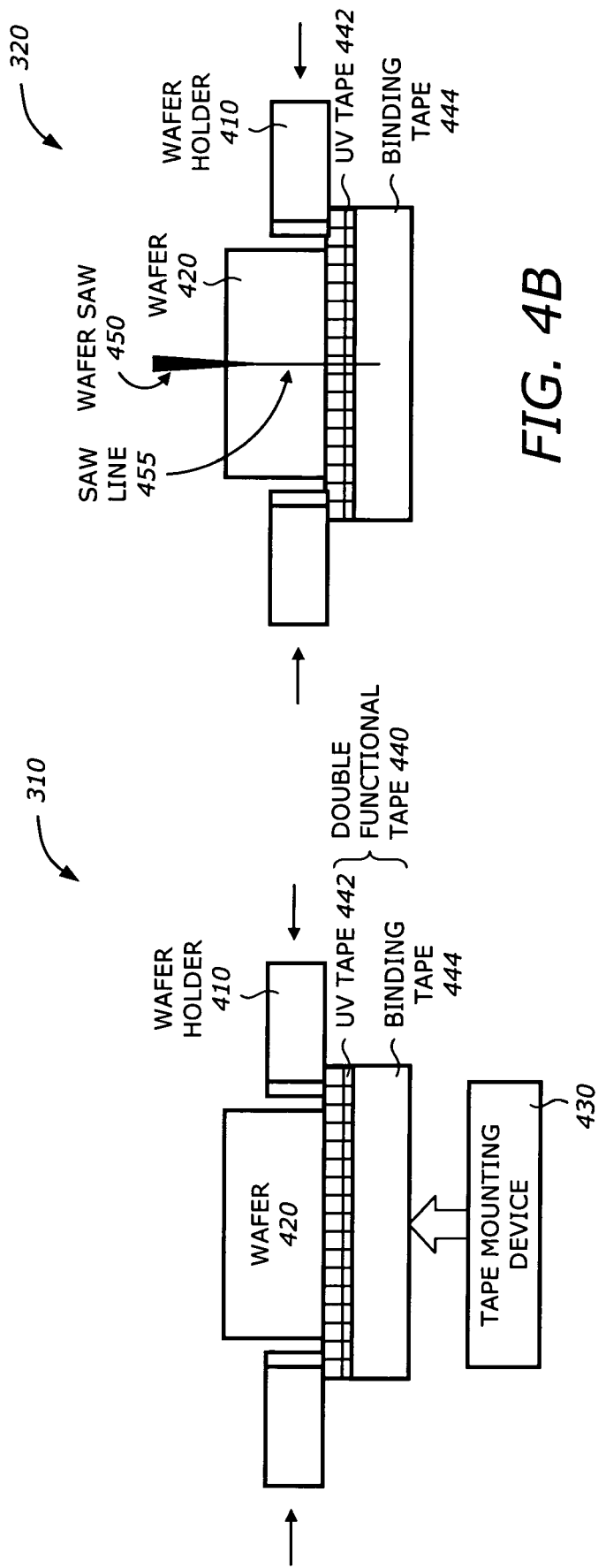
FIG. 4A is a diagram illustrating a double functional tape mounting according to one embodiment of the invention.
FIG. 4B is a diagram illustrating a wafer saw according to one embodiment of the invention.

FIG. 4A is a diagram illustrating a double functional tape mounting 310 according to one embodiment of the invention. The mounting 310 includes a wafer holder 410 and a tape mounting device 430.

The wafer holder 410 holds a wafer 420. The backside of the wafer 420 is exposed to the tape mounting device 430. The tape mounting device 430 mounts a double functional tape 440 to the backside of the wafer 420. The tape 440 includes a layer of UV curable tape 442 and a binding tape 444. The UV tape 442 is applied directly on the surface of the backside of the wafer 420.

FIG. 4B is a diagram illustrating a wafer saw according to one embodiment of the invention. The wafer saw singulation 320 includes a wafer saw 450. The wafer saw 450 cuts or singulates the wafer 420 according to the saw line 455. The saw line 455 goes through the UV tape 442 but only goes through partially the binding tape 444.

After the wafer saw/singulation, the UV tape 442 remains bonded to the singulated flip chip die. The adhesive strength of the UV tape 442 helps keeping the tape to be bonded to the die. The singulated die then go through the rest of the process as described in FIG. 1 except that there is no UV tape application 140.

Figure 5:
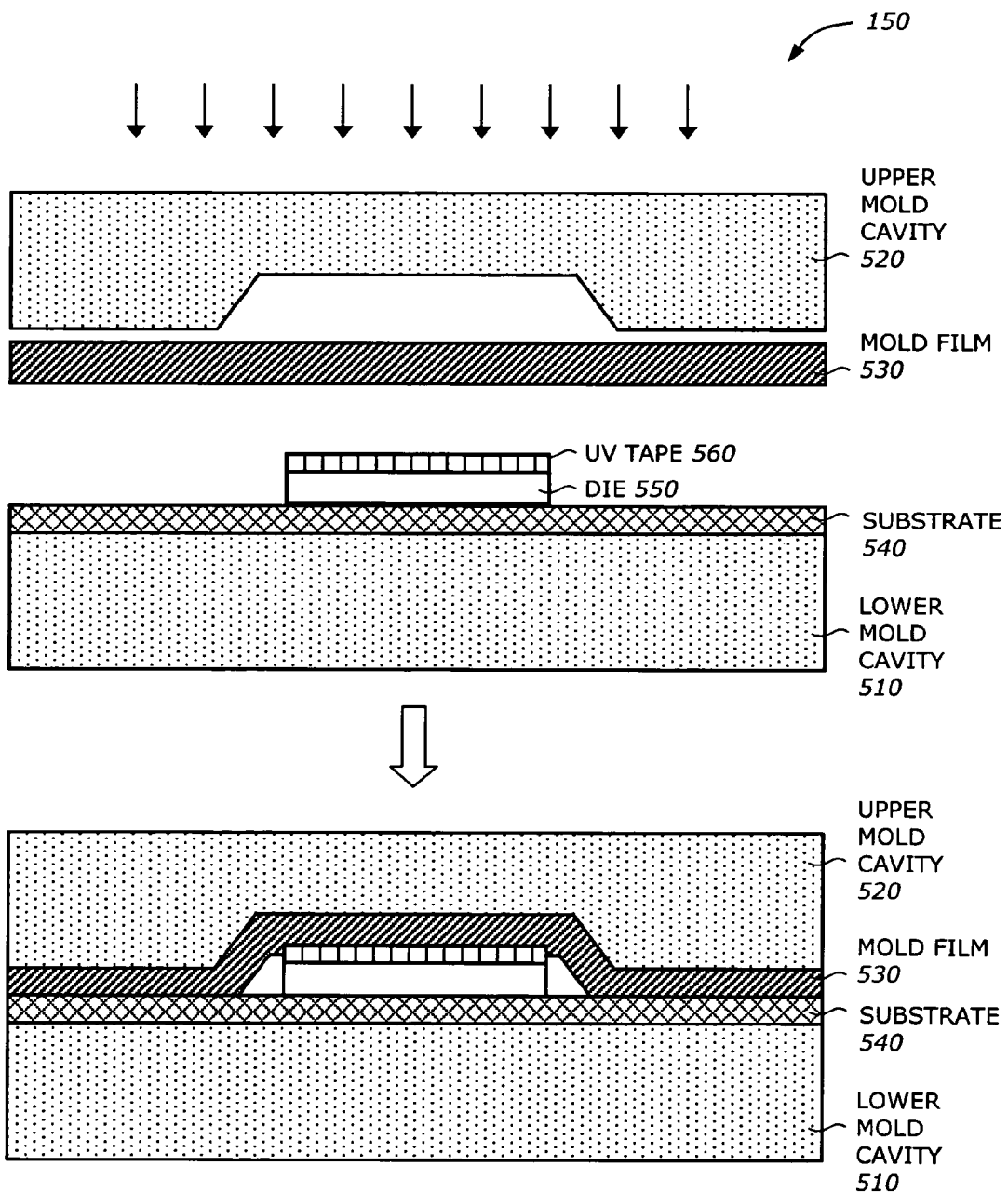
FIG. 5 is a diagram illustrating a mold assembly according to one embodiment of the invention.

FIG. 5 is a diagram illustrating the molding 150 according to one embodiment of the invention. The molding 150 uses a mold assembly that includes a lower mold cavity 510, an upper mold cavity 520, and a mold film 530.

The lower mold cavity 510 provides mechanical support for the strip. For illustration purposes, only one chip is shown to include a substrate 540, a die 550, and a UV tape 560. The upper mold 520 is moved downward to press the mold film 530 on the UV tape 560. The molding process is performed as in a normal molding process.

Figure 6:
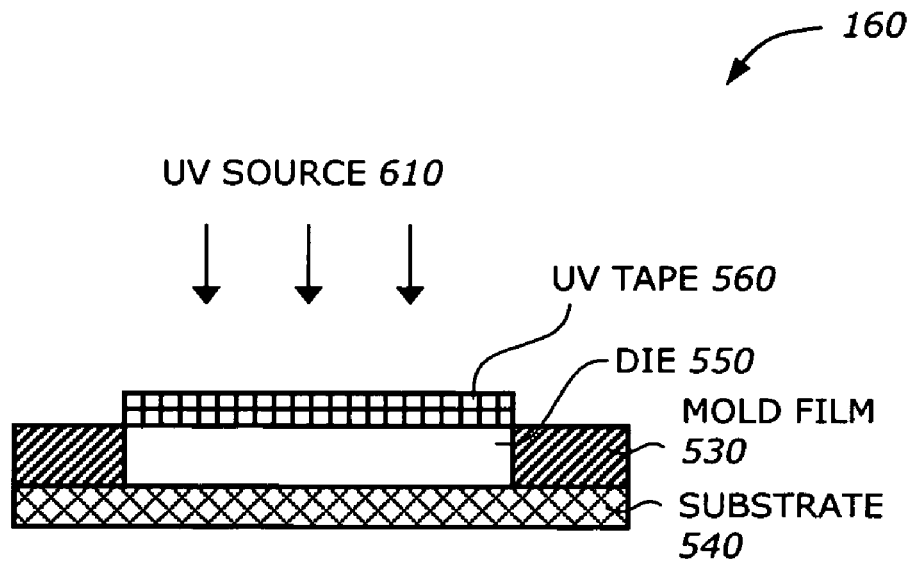
FIG. 6 is a diagram illustrating a UV irradiation according to one embodiment of the invention.

FIG. 6 is a diagram illustrating a UV irradiation 160 according to one embodiment of the invention. The UV irradiation 160 includes a UV source 610.

After the molding 150, the strip of arrays of flip chips is transferred to a UV chamber for irradiation. The UV source 610 is any UV source that can generates UV beam with a radiation dosage that is strong enough to weaken the adhesive strength of the UV tape 560. The UV radiation is applied uniformly on the tape. The UV radiation is adjusted according to the characteristics of the UV tape as provided by the tape supplier or manufacturer.

Figure 7:
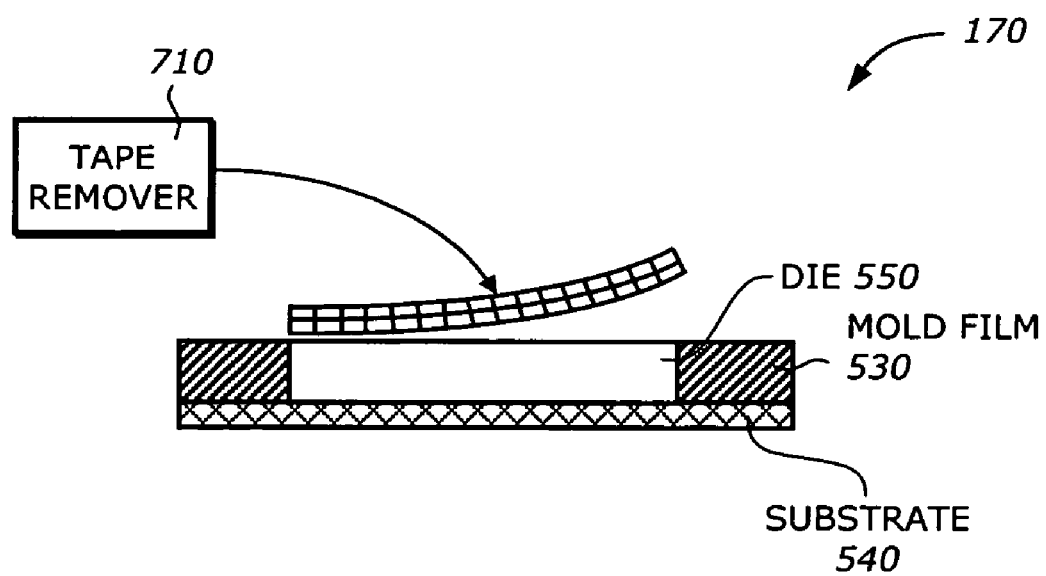
FIG. 7 is a diagram illustrating a tape remover according to one embodiment of the invention.

FIG. 7 is a diagram illustrating the tape removal 170 according to one embodiment of the invention. The tape removal 170 includes a tape remover 710.

The tape remover 710 removes the UV tape 560 from the die 550 of strip of arrays of flip chip. Because the UV tape 560 has been subjected to the UV irradiation 160, its adhesive strength is significantly reduced. Therefore, it can be easily peeled off from the die 550 by the tape remover 710. The removal 170 may be achieved by automated or manually peeling process.

The two embodiments shown in FIGS. 1 and 3 illustrate the two different ways that the UV tape is applied. Although the two embodiments are equivalent in terms of preventing the mold flash, the embodiment in FIG. 3 may be more economical and has shorter throughput time. The embodiment of FIG. 1 may incur more additional indirect material costs because the UV tape needs to be precut in a separate stage.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   laminating an ultraviolet (UV) curable tape on die backside of a strip of array of flip chips, the UV curable tape having an adhesive strength;
   molding the strip with a mold film; and
   irradiating the molded strip using UV radiation.
2. The method of claim 1 further comprising:
   removing the UV curable tape from the strip.
3. The method of claim 2 further comprising:
   singulating the strip.
4. The method of claim 1 wherein laminating the UV curable tape comprises:
   precutting the UV curable tape to fit the strip;
   attaching the UV curable tape to a roller assembly;
   bonding the UV curable tape to back side of the flip chips using the roller assembly; and
   cutting the UV curable tape.
5. The method of claim 1 wherein molding comprises:
   applying a mold to press the mold film on the strip; and
   removing the mold film.
6. The method of claim 1 wherein irradiating comprises:
   irradiating the molded strip with a radiation dosage sufficient to reduce the adhesive strength of the UV curable tape.
7. A method comprising:
   mounting a double functional tape to backside of a wafer, the double functional tape including a binding tape and an ultraviolet (UV) curable tape having an adhesive strength;
   singulating the wafer into a plurality of dice;
   attaching the die to a substrate strip array to form a strip of array of flip chips;
   molding the strip with a mold film; and
   irradiating the molded strip using UV radiation.
8. The method of claim 7 further comprising:
   removing the UV curable tape from the strip.
9. The method of claim 8 further comprising:
   singulating the strip.
10. The method of claim 7 wherein singulating the wafer comprises:
    cutting through the UV curable tape; and
    cutting partially the binding tape.
11. The method of claim 7 wherein molding comprises:
    applying a mold to press the mold film on the strip; and
    removing the mold film.
12. The method of claim 7 wherein irradiating comprises:
    irradiating the molded strip with a radiation dosage sufficient to reduce the adhesive strength of the UV curable tape.

* * * * *